(12) United States Patent
Kinoshita

(10) Patent No.: US 10,297,447 B2
(45) Date of Patent: May 21, 2019

(54) HIGH ELECTRON MOBILITY TRANSISTOR MANUFACTURING METHOD AND HIGH ELECTRON MOBILITY TRANSISTOR

(71) Applicant: Mitsubishi Electric Corporation, Tokyo (JP)

(72) Inventor: Hiroyuki Kinoshita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/713,727

(22) Filed: Sep. 25, 2017

(65) Prior Publication Data

US 2018/0197737 A1    Jul. 12, 2018

(30) Foreign Application Priority Data

Jan. 12, 2017   (JP) .................... 2017-003299

(51) Int. Cl.
| | |
|---|---|
| H01L 21/02 | (2006.01) |
| H01L 21/263 | (2006.01) |
| H01L 29/66 | (2006.01) |
| H01L 29/778 | (2006.01) |
| H01L 29/207 | (2006.01) |
| H01L 29/20 | (2006.01) |

(52) U.S. Cl.
CPC .... *H01L 21/02579* (2013.01); *H01L 21/0254* (2013.01); *H01L 21/0262* (2013.01); *H01L 21/02458* (2013.01); *H01L 21/02502* (2013.01); *H01L 21/263* (2013.01); *H01L 29/2003* (2013.01); *H01L 29/207* (2013.01); *H01L 29/66462* (2013.01); *H01L 29/778* (2013.01)

(58) Field of Classification Search
CPC ........... H01L 21/02579; H01L 21/0254; H01L 21/0262; H01L 21/263; H01L 29/2003; H01L 29/207; H01L 29/66462; H01L 29/778
USPC ........................................................ 257/431
See application file for complete search history.

(56) References Cited

U.S. PATENT DOCUMENTS

| | | | |
|---|---|---|---|
| 3,872,493 A * | 3/1975 | Roberts ................ | H01L 21/00 257/171 |
| 2002/0096692 A1 | 7/2002 | Nakamura et al. | |
| 2006/0108606 A1* | 5/2006 | Saxler ................. | H01L 21/318 257/200 |
| 2007/0120181 A1* | 5/2007 | Ruething ............ | H01L 29/0834 257/328 |

(Continued)

FOREIGN PATENT DOCUMENTS

| | | |
|---|---|---|
| JP | S50-126180 A | 10/1975 |
| JP | 2002-057158 A | 2/2002 |

(Continued)

OTHER PUBLICATIONS

Schottky barrier photodetector based on Mg-doped p-type GaN films, by Asif Khan et al., Appl Phys Lett, V63, No. 18, 2455-2456 (1993).*

*Primary Examiner* — Hrayr A Sayadian
(74) *Attorney, Agent, or Firm* — Studebaker & Brackett PC

(57) ABSTRACT

Examples of a high electron mobility transistor manufacturing method includes forming a buffer layer including a nitride semiconductor doped with any one of carbon, iron, and magnesium on a substrate, forming a Schottky layer on the buffer layer, and irradiating the Schottky layer and the buffer layer with electrons or protons.

11 Claims, 4 Drawing Sheets

(56) References Cited

U.S. PATENT DOCUMENTS

| | | | |
|---|---|---|---|
| 2012/0211770 A1* | 8/2012 | Shiomi | H01L 21/0495 257/77 |
| 2015/0236122 A1* | 8/2015 | Ren | H01L 29/66462 257/76 |
| 2017/0250273 A1* | 8/2017 | Schultz | H01L 29/7783 |
| 2018/0069085 A1* | 3/2018 | Laboutin | H01L 21/02381 |

FOREIGN PATENT DOCUMENTS

| | | |
|---|---|---|
| JP | 2003-197643 A | 7/2003 |
| JP | 2004-311913 A | 11/2004 |
| JP | 2007-251144 A | 9/2007 |
| SG | 2003_022001 A | 4/2003 |
| WO | 2012/053081 A1 | 4/2012 |

* cited by examiner

HIGH ELECTRON MOBILITY TRANSISTOR MANUFACTURING METHOD AND HIGH ELECTRON MOBILITY TRANSISTOR

BACKGROUND

Field

The present invention relates to a high electron mobility transistor manufacturing method and a high electron mobility transistor manufactured by the manufacturing method.

Background Art

Semiconductor elements formed by using nitride semiconductors are promising high-voltage or high-speed elements because of inherent characteristics of compound semiconductor materials. In recent years, high electron mobility transistors (HEMTs) formed by using nitride semiconductors have been gradually brought into practical use.

In conventional high electron mobility transistors formed by using GaN compound semiconductors, which are nitride semiconductors, a lower buffer layer of AlN or GaN is formed on a sapphire, Si, or SiC substrate at a low temperature, and a buffer layer of GaN and an electron supply layer of AlGaN are stacked thereon in this order, thus forming a heterojunction structure. A source electrode, a gate electrode, and a drain electrode are provided on the electron supply layer.

In such a high electron mobility transistor, two-dimensional electron gas formed directly under the heterojunction interface between the buffer layer and the electron supply layer is used as carriers. When bias voltages are applied to the source electrode and the drain electrode, electrons move through the two-dimensional electron gas layer at high speed to travel from the source electrode to the drain electrode. At this time, the current between the source electrode and the drain electrode can be controlled by controlling the voltage applied to the gate electrode to change the thickness of a depletion layer directly under the gate electrode.

To reduce a leakage current in the butler layer, the resistance of the buffer layer needs to be increased. In the case where the resistance of the buffer layer is not increased, a drain leakage increases which flows between the source and the drain through the buffer layer in a state in which the drain current is turned off. Japanese Patent Application Publication Nos. 2002-57158, 2003-197643, and 2007-251144 propose methods for increasing the resistance of a buffer layer. In the methods of Japanese Patent Application Publication Nos. 2002-57158, 2003-197643, and 2007-251144, a buffer layer made of GaN is doped with impurities such as Zn, Mg, or carbon to increase the resistance of the buffer layer.

The resistance of a semiconductor can also be increased by radioactive ray irradiation such as electron-beam or proton irradiation. Japanese Patent Application Publication No. S50-126180 and International Patent Application Publication No. WO2012/053081 disclose methods for increasing the resistance of a semiconductor by irradiating the semiconductor with an electron beam or protons.

To reduce the drain leakage, impurities need to be added to the buffer layer. However, if too many impurities are added to the buffer layer, turn-on characteristics are changed. For example, in high electron mobility transistors using GaN semiconductors, if too many impurities are added to a GaN semiconductor, traps formed by the impurities cause fluctuations in characteristics such as current collapse or threshold shifts. Current collapse is a phenomenon in which temporal changes in an output current lead to poor reproducibility of output current characteristics. It is inferred that such a phenomenon arises as follows: when a current is passed through a semiconductor element, some of added impurities are charged, and an electric charge built directly or indirectly influences electron motion in a two-dimensional electron gas layer.

Accordingly, it is difficult to achieve both of a reduction in fluctuations in turn-on characteristics and a reduction in drain leakage. High electron mobility transistors have been required in which drain leakage can be reduced by doping a butler layer with impurities while fluctuations in turn-on characteristics are reduced.

SUMMARY

The present invention has been accomplished to solve the above-described problem, and an object of the present invention is to provide a high electron mobility transistor manufacturing method which can reduce drain leakage by doping a buffer layer with impurities while reducing fluctuations in turn-on characteristics and a high electron mobility transistor manufactured by the manufacturing method.

In some examples, a high electron mobility transistor manufacturing method includes forming a buffer layer including a nitride semiconductor doped with any one of carbon, iron, and magnesium, forming a Schottky layer on the buffer layer, and irradiating the Schottky layer and the buffer layer with electrons or protons.

In some examples, a high electron mobility transistor includes a buffer layer including a nitride semiconductor doped with any one of carbon, iron, and magnesium, a Schottky layer formed on the buffer layer, a gate electrode provided on the Schottky layer, a source electrode provided on the Schottky layer, and a drain electrode provided on the Schottky layer, wherein first trapping centers originating from the any one of carbon, iron, and magnesium and second trapping centers are formed in the buffer layer, a density of the second trapping centers increasing toward a top of the buffer layer.

DETAILED DESCRIPTION

High electron mobility transistor manufacturing methods and high electron mobility transistors according to embodiments of the present invention will be described with reference to the drawings. The same or corresponding components will be denoted by the same reference signs, and the repetition of explanation thereof may be omitted.

Embodiment 1.

Figure 1:
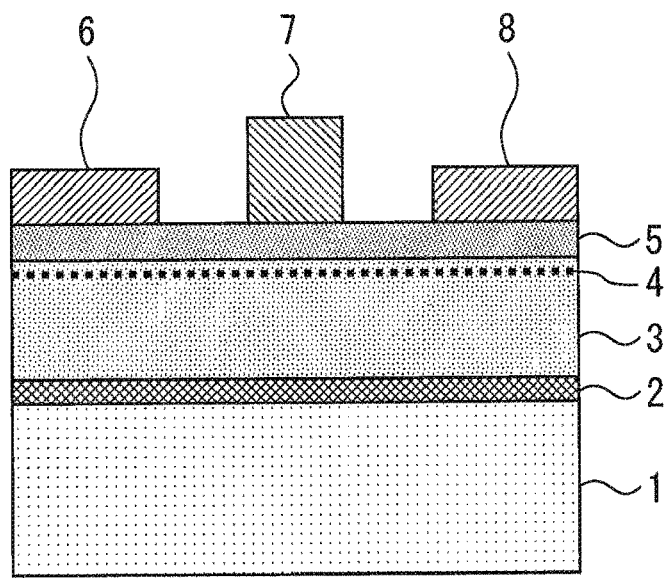
FIG. 1 is a cross-sectional view of a high electron mobility transistor according to Embodiment 1.

FIG. 1 is a cross-sectional view of a high electron mobility transistor according to Embodiment 1. This high electron mobility transistor includes a substrate 1 made of, for example, sapphire, Si, or SiC. A plurality of compound semiconductor layers are stacked on the substrate 1. Specifically, a lower buffer layer 2 formed on the substrate 1, a buffer layer 3 formed on the lower buffer layer 2, and a Schottky layer 5 formed on the buffer layer 3 are formed.

The lower buffer layer 2 includes AlN or GaN formed at a low temperature, and therefore may be referred to as a low-temperature buffer layer. The buffer layer 3 is formed of GaN doped with carbon. The Schottky layer 5 is formed of AlGaN. The lower buffer layer 2, the buffer layer 3, and the Schottky layer 5 are stacked in this order on the substrate 1 to form a heterojunction structure.

A gate electrode 7, a source electrode 6, and a drain electrode 8 are formed on the Schottky layer 5. The source electrode 6 and the drain electrode 8 as ohmic electrodes are formed by stacking AlTi and Au in this order on the Schottky layer 5. The gate electrode 7 as a Schottky electrode is formed by stacking Pt and Au in this order on the Schottky layer 5.

In the above-described high electron mobility transistor, two-dimensional electron gas 4 is formed directly under the heterojunction interface between the Schottky layer 5 and the buffer layer 3. This two-dimensional electron gas 4 is used as a carrier transit layer. Specifically, when bias voltages are applied to the source electrode 6 and the drain electrode 8, electrons supplied from the Schottky layer 5 to the buffer layer 3 move through the two-dimensional electron gas 4 to travel to the drain electrode 8. At this time, the current flowing from the source electrode 6 to the drain electrode 8 is controlled by controlling the voltage applied to the gate electrode 7 to change the thickness of a depletion layer directly under the gate electrode 7.

Figure 2:
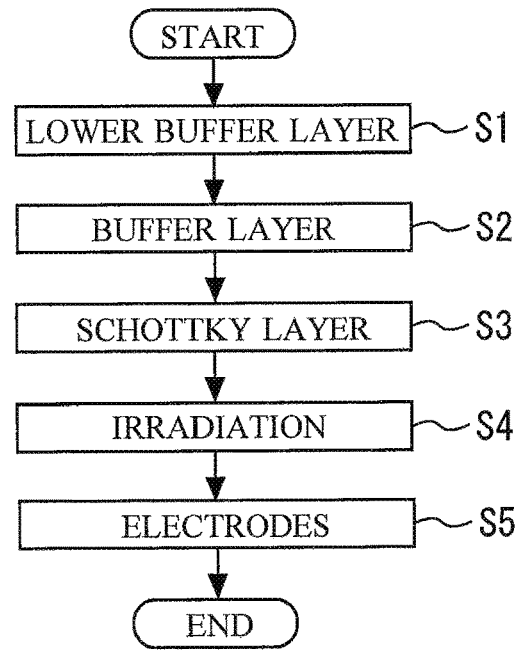
FIG. 2 is a flowchart showing a high electron mobility transistor manufacturing method according to Embodiment 1.

FIG. 2 is a flowchart showing a high electron mobility transistor manufacturing method according to Embodiment 1. Steps S1, S2, and S3 are the steps of stacking nitride semiconductors by MOCVD (Metal Organic Chemical Vapor Deposition). Steps S1, S2, and S3 are performed while 100% concentration hydrogen is continuously being fed as carrier gas into an MOCVD system in which the substrate 1 is disposed, in the steps of forming the respective layers, with the pressure kept at 26.7 Kpa (200 Torr).

In this environment, in step S1, trimethylaluminum (TMA) and ammonia ($NH_3$) as raw materials for a compound semiconductor are introduced into the MOCVD system at flow rates of 150 μmol/min and 11 slm, respectively, and the lower buffer layer 2 of AlN is epitaxially grown on the substrate 1 at a growth temperature of 950° C. The layer thickness of the lower buffer layer 2 is, for example, 30 nm.

Subsequently, in step S2, trimethylgallium (TMG) and $NH_3$ are introduced into the MOCVD system at flow rates of 220 μmol/min and 11 slm, respectively, and the buffer layer 3 of GaN doped with carbon is epitaxially grown on the lower buffer layer 2 at a growth temperature of 1050° C. The layer thickness of the buffer layer 3 is, for example, 2 μm. The step of forming the buffer layer 3 is referred to as a buffer layer formation step. In the buffer layer formation step, the growth rate of the buffer layer 3 is controlled so that the concentration of carbon added to the buffer layer 3 may be not less than $1\times10^{16}$ $cm^{-3}$ nor more than $5\times10^{16}$ $cm^{-3}$. The conductivity type of the buffer layer 3 is p type.

Subsequently, in step S3, TMA; TMG, and TMG, and $NH_3$ are introduced into the MOCVD system at flow rates of 100 μmol/min, and 1 slm, respectively, and the Schottky layer 5 of AlGaN is epitaxially grown at a growth temperature of 1050° C. The layer thickness of the Schottky layer 5 is, for example, 30 nm. The step of forming the Schottky layer 5 on the buffer layer 3 is referred to as a Schottky layer formation step.

Subsequently, step S4 is performed. In step S4, the substrate in which nitride semiconductors have been epitaxially grown in steps S1, S2, and S3 is irradiated with an electron beam by an electron beam accelerator. This step is referred to as an irradiation step. In the irradiation step, electrons are applied at an energy of not less than 150 KeV with a fluence of $1\times10^{16}$ to $1\times10^{19}/cm^2$. In the irradiation step, an electron beam is applied from above the Schottky layer 5 to irradiate the Schottky layer 5 and the buffer layer 3 with electrons.

Figure 3:
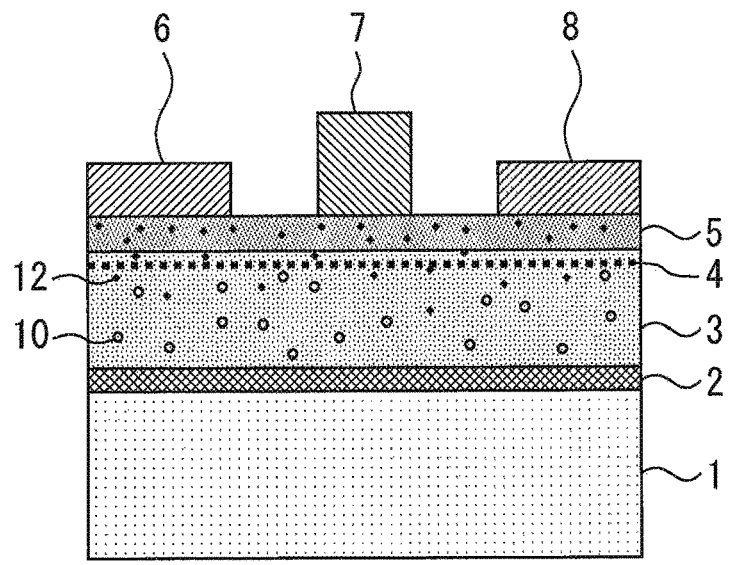
FIG. 3 is a view showing trapping centers.

FIG. 3 is a view showing trapping centers in the buffer layer 3 and the Schottky layer 5. In the buffer layer 3, first trapping centers 10 originating from the doped carbon are formed. The density of the first trapping centers 10 is preferably uniform. In this specification, the term uniform means not just being strictly uniform but also being substantially uniform. In the buffer layer 3 and the Schottky layer 5, second trapping centers 12 originating from defects formed by electrons applied in the irradiation step are formed. Accordingly, the buffer layer 3 has the second trapping centers 12 as well as the first trapping centers 10. The density of the second trapping centers 12 in the buffer layer 3 and the Schottky layer 5 increases toward the top. Accordingly, the density of the second trapping centers 12 in the buffer layer 3 is higher in a region near the Schottky layer 5 than in a region near the lower buffer layer 2.

In the irradiation step, electrons may be applied after a mask of heavy metal such as tungsten or zirconium is formed by patterning using photolithography. This allows the electron beam to be absorbed by the mask, and enables the electron beam to be applied only to a desired region. In regions such as a region directly under the drain, charges and traps formed by electron beam irradiation may influence a change in the depletion layer. Accordingly, it is preferable that a region directly under the drain electrode 8 is prevented from being irradiated with electrons by forming a mask. It should be noted that since nitride semiconductors have good radiation resistance, even a mask having a low radiation shielding selectivity can be expected to significantly absorb an electron beam.

Subsequently, step S5 is performed. In step S5, first, a mask of a silicon oxide film is formed on the Schottky layer 5 by patterning using photolithography. After that, opening portions corresponding to the respective electrode shapes are formed in regions of the mask in which the source electrode 6 and the drain electrode 8 are to be formed. Then, Al, Ti, and Au are vapor-deposited in this order in the opening portions to form the source electrode 6 and the drain electrode 8.

Further, a portion of the mask on the Schottky layer 5 is removed once, and a mask of a silicon oxide film is formed on the Schottky layer 5. After that, an opening portion corresponding to the gate electrode shape is formed in a region of the mask in which the gate electrode 7 is to he formed. Then, Pt and Au are vapor-deposited in this order in this opening portion to form the gate electrode 7. Thus, the high electron mobility transistor in FIG. 1 is completed. The resistivity of the buffer layer 3 of the completed high electron mobility transistor is preferably not less than 900 Ωcm.

(Current Collapse)

Figure 4:
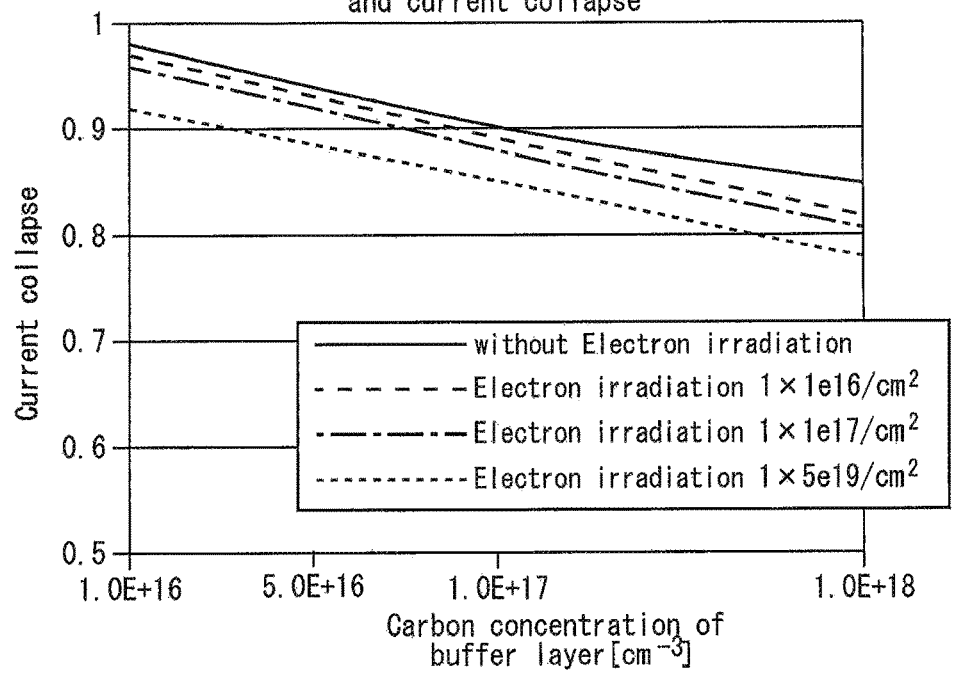
FIG. 4 is a view showing the relationship between the carbon concentration and current collapse.

FIG. 4 is a view showing the relationship between the carbon concentration in the buffer layer 3 and current collapse. The thickness of the buffer layer 3 is 2 μm. Current collapse is a phenomenon in which the on-state resistance value of a high electron mobility transistor during high-voltage operation becomes higher than the on-state resistance thereof during low-voltage operation. In other words, the on-state resistance changes according to the state of application of the drain voltage. To quantify changes in the on-state resistance caused by current collapse, the voltage between the source electrode 6 and the drain electrode 8 when the high electron mobility transistor is in the on state is scanned in ranges of 0 to 10 V and 0 to 30 V, and the ratio between current values obtained for 10 V in the respective ranges is regarded as current collapse. As the current collapse approaches "1.0," the reproducibility of output current characteristics of the high electron mobility transistor becomes better. Accordingly, the value of current collapse is desirably close to 1. The value of current collapse is preferably not less than 0.8, and more preferably not less than 0.9.

FIG. 4 is a view in which actual measurement values are plotted. In FIG. 4, the result denoted by "without electron beam irradiation" relates to a high electron mobility transistor manufactured with the irradiation step skipped. Other three results relate to high electron mobility transistors irradiated with electron beams of $1\times1e16/cm^2$, $1\times1e17/cm^2$, and $1\times5e19/cm^2$ in the irradiation step. FIG. 4 shows that as the carbon concentration of the buffer layer 3 increases, current collapse becomes worse. In the case of "without electron beam irradiation," if the carbon concentration increases to $1\times10^{17}$ cm$^{-3}$ or more, current collapse decreases to 0.9 or less. Meanwhile, it can be seen that in the case where an electron beam is applied in the irradiation step, current collapse becomes worse as the fluence thereof increases.

(Drain Leakage)

Figure 5:
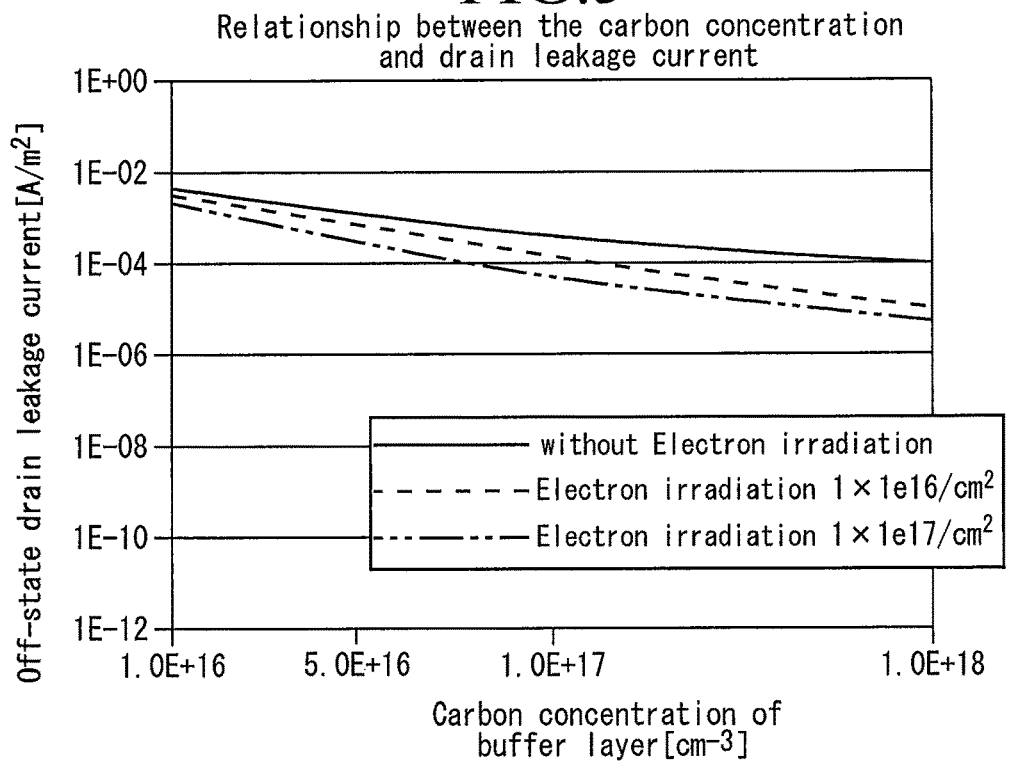
FIG. 5 is a view showing the relationship between the carbon concentration and drain leakage current.

FIG. 5 is a view showing the relationship between the carbon concentration of the buffer layer 3 and drain leakage current. Drain leakage is a leakage current flowing between the source and the drain when the voltage between the source and the drain is 200 V when a high electron mobility transistor is in the off state. When the drain leakage becomes large, the element cannot be sufficiently turned off when the high electron mobility transistor is in the off state. When the drain leakage exceeds $1\times10^{-3}$ A/m$^2$, application as a transistor becomes difficult. FIG. 5 shows that as the carbon concentration in the buffer layer 3 decreases, the drain leakage increases. In particular, when the carbon concentration decreases to a value of not more than $5\times10^{16}$ cm$^{-3}$, the drain leakage increases to a value of not less than $1\times10^{-3}$ A/m$^2$.

In FIG. 5, the result denoted by "without electron beam irradiation" relates to a high electron mobility transistor manufactured with the irradiation step skipped. Other two results relate to high electron mobility transistors irradiated with electron beams of $1\times1e16/cm^2$ and $1\times1e17/cm^2$ in the irradiation step. FIG. 5 shows that in the case where an electron beam is applied in the irradiation step, the drain leakage becomes lower as the fluence thereof increases.

(Nonlinearization of IV Characteristics)

Figure 6:
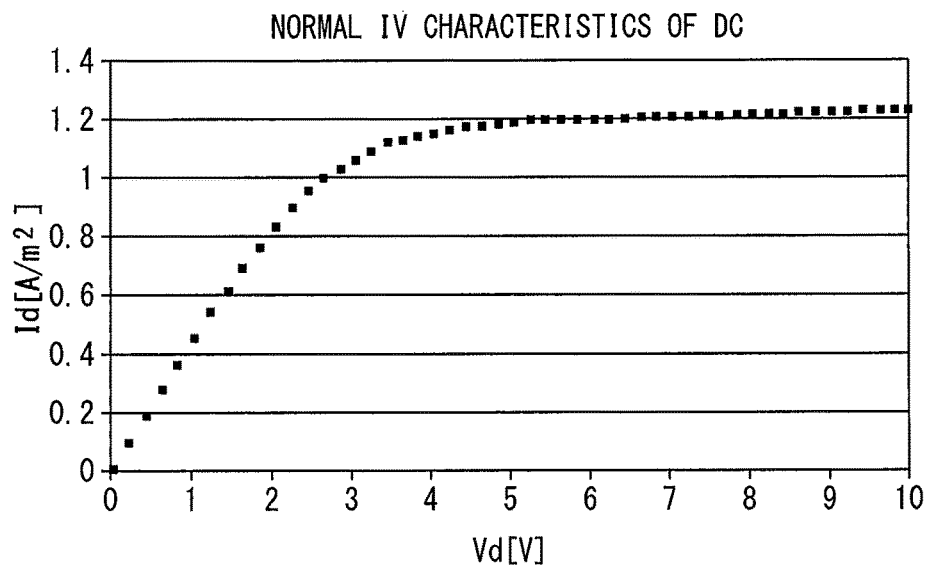
FIG. 6 is a view showing normal IV characteristics.
Figure 7:
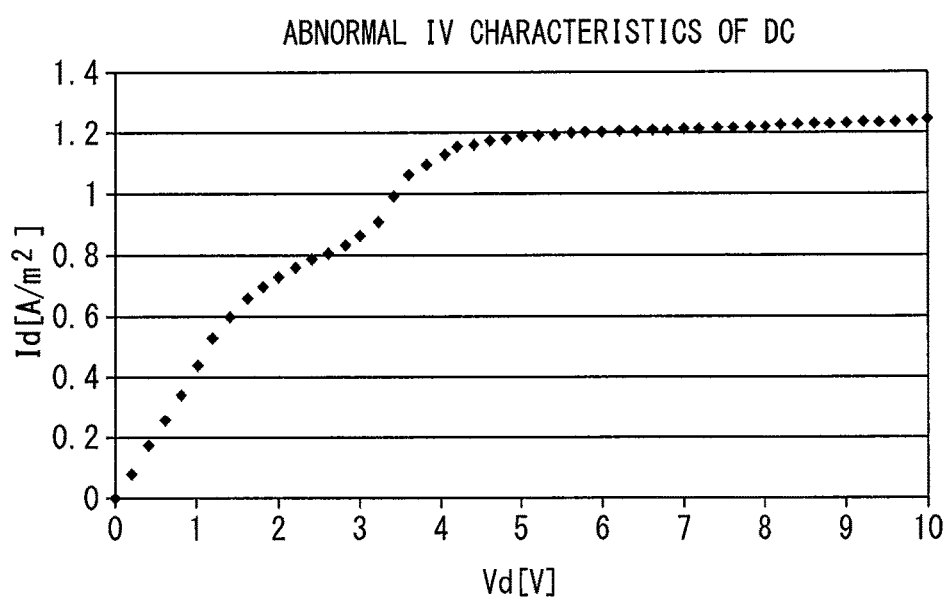
FIG. 7 is a view showing IV characteristics of a high electron mobility transistor.

FIG. 6 is a view showing normal IV characteristics of a high electron mobility transistor using a GaN layer. An ideal IV characteristics waveform of a high electron mobility transistor is linear as shown in FIG. 6. However, if the concentration of carbon added to the buffer layer becomes too high, the IV characteristics waveform becomes nonlinear. FIG. 7 is a view showing IV characteristics of a high electron mobility transistor having a buffer layer with a high carbon concentration. If the carbon concentration of the buffer layer becomes too high, there occurs a phenomenon in which the drain current does not linearly increase with respect to the drain voltage. Specifically, if the carbon concentration of the buffer layer becomes larger than $5\times10^{16}$ cm$^{-3}$, the IV characteristics waveform becomes nonlinear. Accordingly, in Embodiment 1 of the present invention, the concentration of carbon added to the buffer layer 3 is set to a value of not less than $1\times10^{16}$ cm$^{-3}$ nor more than $5\times10^{16}$ cm$^{-3}$. Thus, IV characteristics deterioration can be avoided.

Referring to the result of "without electron beam irradiation" in FIG. 4 and the result of "without electron beam irradiation" in FIG. 5, to obtain a current collapse of not less than 0.9 and a drain leakage of not more than $1\times10^{-3}$ A/m$^2$ in the case where an electron beam is not applied, the carbon concentration of the buffer layer 3 is preferably more than $5\times10^{16}$ cm$^{-3}$ and less than $1\times10^{17}$ cm$^{-3}$, and more preferably more than $7\times10^{16}$ cm$^{-3}$ and less than $8\times10^{16}$ cm$^{-3}$. It is not easy to accurately add carbon to a concentration in that range, it is more difficult to add carbon to a concentration in the above-described range over the entire wafer surface.

Moreover, to prevent the nonlinearization of IV characteristics, the concentration of carbon added to the buffer layer 3 must be not more than $5\times10^{16}$ cm$^{-3}$. Accordingly, in the case where the carbon concentration is more than $5\times10^{16}$ cm$^{-3}$ and less than $1\times10^{17}$ cm$^{-3}$, or in the case where the carbon concentration is more than $7\times10^{16}$ cm$^{-3}$ and less than $8\times10^{16}$ cm$^{-3}$, the nonlinearization of IV characteristics cannot be prevented. Accordingly, without electron irradiation, there is no carbon concentration range in which the current collapse is not less than 0.9, the drain leakage is not more than $1\times10^{-3}$ A/m$^2$, and the nonlinearization of IV characteristics can be prevented.

Accordingly, in the high electron mobility transistor according to Embodiment 1 of the present invention, together with the addition of carbon to the buffer layer 3, defects are introduced into the buffer layer 3 by applying an electron beam so that the current collapse may be not less than 0.9, the drain leakage may be not more than $1\times10^{-3}$ A/m$^2$, and the nonlinearization of IV characteristics may be prevented. Specifically, the concentration of carbon added to the buffer layer 3 is not less than $1\times10^{16}$ cm$^{-3}$ nor more than $5\times10^{16}$ cm$^{-3}$. Further, in the irradiation step, electrons are applied at an energy of not less than 150 KeV with a fluence of $1\times10^{16}$ to $1\times10^{19}$/cm$^2$.

From FIG. 4, it can be seen that in the case where the carbon concentration of the buffer layer 3 is not less than $1\times10^{16}$ cm$^{-3}$ nor more than $5\times10^{16}$ cm$^{-3}$, electron irradiation with a fluence of $1\times10^{16}$ to $1\times10^{19}$/cm$^2$ can increase the current collapse to 0.9 or more, i.e., can limit a reduction in the current value caused by a current collapse phenomenon to 10% or less. When the fluence of the electron beam exceeds $1\times10^{19}$/cm$^2$, the current collapse starts significantly decreasing. Accordingly, an upper limit for the fluence is set to $1\times10^{19}$/cm$^2$.

From FIG. 5, it can be seen that in the case where the carbon concentration of the buffer layer 3 is not less than $1\times10^{16}$ cm$^{-3}$ nor more than $5\times10^{16}$ cm$^{-3}$, electron irradiation with a fluence of $1\times10^{16}$ to $1\times10^{19}$/cm$^2$ can reduce the drain leakage current to $1\times10^{-3}$ A/m$^2$ or less. In the case where electron irradiation is performed, lower drain leakage can be achieved compared to the case where electron irradiation is not performed. Accordingly, even if the carbon concentration of the buffer layer 3 is reduced to $3\times10^{16}$ cm$^{-3}$ or less, the drain leakage can be reduced to approximately $1\times10^{-3}$ A/m$^2$ or less. If the carbon concentration of the buffer layer 3 is approximately $1\times10^{16}$ cm$^{-3}$, the drain leakage reduction effect of electron beam irradiation is small. Accordingly, the buffer layer needs to be not just irradiated with an electron beam but also doped with carbon. The concentration of carbon added to the buffer layer 3 is preferably not less than $1\times10^{16}$ cm$^{-3}$ nor more than $5\times10^{16}$ cm$^{-3}$. If the concentration of carbon added to the buffer layer 3 is not less than $1\times10^{16}$ cm$^{-3}$ nor more than $3\times10^{16}$ cm$^{-3}$, the drain leakage can be reduced while the current collapse can be made close to 1.

Further, the concentration of carbon added being not less than $1\times10^{16}$ cm$^{-3}$ nor more than $5\times10^{16}$ cm$^{-3}$ can prevent the nonlinearization of IV characteristics. Accordingly, the high electron mobility transistor according to Embodiment 1 of the present invention has favorable characteristics as a high-frequency amplifier transistor used at frequencies in or beyond the L band ranging from 0.5 to 1.5 GHz.

Thus, applying an electron beam in addition to doping the buffer layer 3 with carbon can increase the resistance of the buffer layer 3 and reduce the drain leakage without greatly deteriorating current collapse. Further, the nonlinearization of IV characteristics can be prevented. Thus, the following trade-off problem can be solved: if the carbon concentration of the buffer layer is increased to reduce the drain leakage, current collapse and IV characteristics become worse; and, if the carbon concentration of the buffer layer is reduced to improve current collapse and IV characteristics, the drain leakage increases.

The high electron mobility transistor manufacturing method and the high electron mobility transistor according to Embodiment 1 of the present invention can be variously modified within a range in which features thereof are not lost. For example, the lower buffer layer 2, the buffer layer 3, and the Schottky layer 5 can be formed of nitride semiconductors. Moreover, the layer thickness of each layer can be changed.

These modifications can be applied to high electron mobility transistor manufacturing methods and high electron mobility transistors according to embodiments below. It should be noted that the high electron mobility transistor manufacturing methods and the high electron mobility transistors according to the embodiments below have many things in common with those of Embodiment 1, and therefore differences from Embodiment 1 will be mainly described.

Embodiment 2.

The buffer layer 3 of Embodiment 2 is made of GaN doped with iron instead of carbon. The added iron allows the first trapping centers 10 in FIG. 3 to be introduced. The concentration of iron added to the buffer layer 3 according to Embodiment 2 is preferably not less than $1\times10^{16}$ cm$^{-3}$ nor more than $5\times10^{16}$ cm$^{-3}$, and more preferably not less than $1\times10^{16}$ cm$^{-3}$ nor more than $3\times10^{16}$ cm$^{-3}$. In the buffer layer formation step, the buffer layer is doped with iron at a concentration of not less than $1\times10^{16}$ cm$^{-3}$ nor more than $5\times10^{16}$ cm$^{-3}$ or a concentration of not less than $1\times10^{16}$ cm$^{-3}$ nor more than $3\times10^{16}$ cm$^{-3}$. By doping the buffer layer 3 with iron as described above and applying an electron beam, the same effects as those of the high electron mobility transistor of Embodiment 1 can be obtained.

Embodiment 3.

The buffer layer 3 of Embodiment 3 is made of GaN doped with magnesium instead of carbon. The added magnesium allows the first trapping centers 10 in FIG. 3 to be introduced. The concentration of magnesium added to the buffer layer 3 according to Embodiment 3 is preferably not less than $2\times10^{16}$ cm$^{-3}$ nor more than $2\times10^{17}$ cm$^{-3}$, and more preferably not less than $2\times10^{16}$ cm$^{-3}$ nor more than $1\times10^{17}$ cm$^{-3}$. In the buffer layer formation step, the buffer layer is doped with magnesium at a concentration of not less than $2\times10^{16}$ cm$^{-3}$ nor more than $2\times10^{17}$ cm$^{-3}$ or a concentration of not less than $2\times10^{16}$ cm$^{-3}$ nor more than $1\times10^{17}$ cm$^{-3}$. By doping the buffer layer 3 with magnesium as described above and applying an electron beam, the same effects as those of the high electron mobility transistor of Embodiment 1 can be obtained.

A dopant for introducing the first trapping centers 10 is carbon in Embodiment 1, iron in Embodiment 2, and magnesium in Embodiment 3. The buffer layer 3 may be doped with two or more materials selected from carbon, iron, and magnesium.

Embodiment 4.

In the irradiation step of the high electron mobility transistor manufacturing method according to Embodiment 4, the Schottky layer 5 and the buffer layer 3 are irradiated with protons instead of electrons. Specifically, protons are applied at an accelerating voltage corresponding to an energy of not less than 1 MeV with a fluence of not less than $1\times10^{15}$/cm$^2$. In Embodiment 4, by applying protons instead of electrons, the second trapping centers 12 are introduced. Thus, the same effects as those of the high electron mobility transistor of Embodiment 1 can be obtained.

In accordance with the present invention, a buffer layer is doped with impurities and, further, irradiated with an electron beam or protons. Accordingly, drain leakage can be reduced by doping the buffer layer with impurities while fluctuations in turn-on characteristics are reduced.

What is claimed is:

1. A high electron mobility transistor manufacturing method comprising:
   forming a buffer layer including a nitride semiconductor doped with any one of carbon, iron, and magnesium;
   forming a Schottky layer on the buffer layer;
   forming a mask on the Schottky layer; and
   irradiating the Schottky layer and the buffer layer with electrons or protons, such that the mask prevents an area of the Schottky layer and the buffer layer under a drain electrode from being irradiated during the irradiating.

2. The high electron mobility transistor manufacturing method according to claim 1, wherein in the buffer layer formation, the buffer layer is doped with carbon, and a concentration of the carbon added to the buffer layer is not less than $1\times10^{16}$ cm$^{-3}$ nor more than $5\times10^{16}$ cm$^{-3}$.

3. The high electron mobility transistor manufacturing method according to claim 1, wherein in the buffer layer formation, the buffer layer is doped with carbon, and a concentration of the carbon added to the buffer layer is not less than $1\times10^{16}$ cm$^{-3}$ nor more than $3\times10^{16}$ cm$^{-3}$.

4. The high electron mobility transistor manufacturing method according to claim 1, wherein in the buffer layer formation, the buffer layer is doped with iron, and a concentration of the iron added to the buffer layer is not less than $1\times10^{16}$ cm$^{-3}$ nor more than $5\times10^{16}$ cm$^{-3}$.

5. The high electron mobility transistor manufacturing method according to claim 1, wherein in the buffer layer formation, the buffer layer is doped with magnesium, and a concentration of the magnesium added to the buffer layer is not less than $2\times10^{16}$ cm$^{-3}$ nor more than $2\times10^{17}$ cm$^{-3}$.

6. The high electron mobility transistor manufacturing method according to claim 1, wherein in the irradiation, electrons are applied at an energy of not less than 150 KeV with a fluence of $1\times10^{16}$ to $1\times10^{19}$/cm$^2$.

7. The high electron mobility transistor manufacturing method according to claim 1, wherein in the irradiation, protons are applied at an energy of not less than 1 MeV with a fluence of not less than $1 \times 10^{15}/cm^2$.

8. The high electron mobility transistor manufacturing method according to claim 1, wherein the buffer layer has a resistivity of not less than 900 Ωcm.

9. The high electron mobility transistor manufacturing method according to claim 1, wherein a conductivity type of the buffer layer is p type.

10. The high electron mobility transistor manufacturing method according to claim 1, wherein in the irradiation, electrons or protons are applied after the mask, which is a mask of heavy metal, is formed.

11. The high electron mobility transistor manufacturing method according to claim 1, further comprising:
    forming a drain electrode and a source electrode on the Schottky layer after performing the irradiating.

* * * * *